United States Patent
Li et al.

(10) Patent No.: US 11,567,618 B2
(45) Date of Patent: Jan. 31, 2023

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Wenqi Li, Hubei (CN); Caiqin Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 618 days.

(21) Appl. No.: 16/478,276

(22) PCT Filed: Apr. 11, 2019

(86) PCT No.: PCT/CN2019/082270
§ 371 (c)(1),
(2) Date: Jul. 16, 2019

(87) PCT Pub. No.: WO2020/124885
PCT Pub. Date: Jun. 25, 2020

(65) Prior Publication Data
US 2021/0405813 A1    Dec. 30, 2021

(30) Foreign Application Priority Data
Dec. 18, 2018   (CN) .......................... 201811555431.9

(51) Int. Cl.
*G06F 3/044* (2006.01)
*H01L 27/32* (2006.01)
*G06F 3/041* (2006.01)

(52) U.S. Cl.
CPC ........... *G06F 3/0446* (2019.05); *G06F 3/0412* (2013.01); *G06F 3/0416* (2013.01); *H01L 27/323* (2013.01)

(58) Field of Classification Search
CPC .... G06F 3/0446; G06F 3/0412; G06F 3/0416; G06F 3/041; H01L 27/323; H01L 27/32
See application file for complete search history.

(56) References Cited

U.S. PATENT DOCUMENTS

2004/0150331 A1    8/2004 Okubo et al.

FOREIGN PATENT DOCUMENTS

CN     201622554 U   * 11/2010   ............. G06F 3/044
CN     104850268 A     8/2015
(Continued)

*Primary Examiner* — Julie Anne Watko (57) ABSTRACT

A display panel and a display device are provided. The display panel includes a substrate, a cathode layer, a touch control layer, and a pixel definition layer. The cathode layer is disposed over the substrate, and the cathode layer is formed with a first gap therein. The touch control layer is not disposed at a side of the cathode layer away from a substrate, and the touch control layer is provided with a plurality of touch control components, and adjacent touch control components in the touch control layer are formed with a second gap therebetween. A supporting wall is disposed over the pixel definition layer, and a height of the supporting wall is greater than a height of the cathode layer, thereby forming the first gap in the cathode layer. The touch control components function as a touch control unit.

12 Claims, 7 Drawing Sheets

(56) References Cited

FOREIGN PATENT DOCUMENTS

| CN | 105679805 A | * | 6/2016 |
| CN | 105679805 A | | 6/2016 |
| CN | 105702205 A | | 6/2016 |
| CN | 107104131 A | | 8/2017 |

* cited by examiner

DISPLAY PANEL AND DISPLAY DEVICE

FIELD OF INVENTION

The present application relates to the field of display technologies, and more particularly to a display panel and a display device.

BACKGROUND

In active-matrix organic light-emitting diode (AMOLED) display panel structures, existing touch control structures are implemented by an on-cell method, which is all the touch control layers are attached to the upmost cathode layer (i.e., a cathode) of an organic light-emitting diode (OLED) along a direction away from the backplate. This is because the cathode is made by an evaporation process using a common mask. The structure is an entire surface. After a finger touches a screen, electric field lines generated are shielded by the cathode layer and cannot penetrate the structure under the cathode.

That is, the existing display panel has technical problems that the touch control structure can only be implemented by the on-cell method.

SUMMARY

The present application provides a display panel and a display device to solve the technical problems that the touch control structure in the existing display panel can only be implemented by the on-cell method.

To solve the above problems, the technical solution provided by the present application is as follows:

An embodiment of the invention provides a display panel, comprising:

a substrate;

a cathode layer disposed over the substrate, wherein the cathode layer is formed with a first gap therein; and a touch control layer, wherein the touch control layer is not disposed at a side of the cathode layer away from the substrate, and the touch control layer is provided with a plurality of touch control components, and the adjacent touch control components in the same touch control layer is formed with a second gap therebetween;

wherein the first and second gaps fulfill predetermined conditions that applies the touch control components as a touch control unit.

In the display panel of the present application, the touch control components in the same touch control layer comprises a driving electrode and an inductive electrode. The second gap is formed between the adjacent driving electrode and inductive electrode. An inductance line between the driving electrode and the inductive electrode passes through the first gap, forming a mutual-capacitance type touch control unit.

In the display panel of the present application, the touch control layer is disposed between the cathode layer and the substrate. A first projection of the first gap over the substrate covers a second projection of the second gap over substrate along a projection direction perpendicular to the substrate.

In the display panel of the present application, the touch control layer is disposed between the cathode layer and the substrate. The first projection of the first gap over the substrate overlaps the second projection of the second gap over substrate along the projection direction perpendicular to the substrate.

In the display panel of the present application, the touch control layer and a signal routing layer of the display panel are disposed in the same layer.

In the display panel of the present application, the touch control components in the same touch control layer comprises a driving electrode and an inductive electrode. The second gap is formed between the adjacent driving electrode and inductive electrode. The touch control layer and the cathode layer are formed in the same layer. The first gap overlaps the second gap.

In the display panel of the present application, the touch control components in the touch control layer comprises a plurality of touch control electrodes. The second gap is formed between the adjacent touch control electrodes. An inductance line between the touch control electrodes passes through the first gap, forming a self-contained type touch control unit.

In the display panel of the present application, the touch control layer comprises a plurality of first touch control layers and a plurality of second touch control layers, and the first touch control layers form first touch control electrodes, and the second touch control layers form inductive electrodes. The first touch control layer and the cathode layer are disposed in the same layer. The adjacent first touch control electrodes form the first gap and the adjacent second touch control electrodes form the second gap. The first projection of the first gap over the substrate crosses with the second projection of the second gap over substrate along a projection direction perpendicular to the substrate. An inductance line between the first touch control electrodes and the second touch control electrodes passes through the first gap, forming a mutual-capacitance type touch control unit.

In the display panel of the present application, the first projection of the first gap over the substrate is perpendicular to the second projection of the second gap over substrate.

The present application provides a display device comprising a display panel, wherein the display panel comprises:

a substrate;

a cathode layer disposed over the substrate, wherein the cathode layer is formed with a first gap therein; and a touch control layer, wherein the touch control layer is not disposed at a side of the cathode layer away from the substrate, and the touch control layer is provided with a plurality of touch control components, and the adjacent touch control components in the same touch control layer is formed with a second gap therebetween;

wherein the first and second gaps fulfill predetermined conditions that applies the touch control components as a touch control unit.

In the display device of the present application, the touch control components in the same touch control layer comprises a driving electrode and an inductive electrode. The second gap is formed between the adjacent driving electrode and inductive electrode. An inductance line between the driving electrode and the inductive electrode passes through the first gap, forming a mutual-capacitance type touch control unit.

In the display device of the present application, the touch control layer is disposed between the cathode layer and the substrate. A first projection of the first gap over the substrate covers a second projection of the second gap over substrate along a projection direction perpendicular to the substrate.

In the display device of the present application, the touch control layer is disposed between the cathode layer and the substrate. The first projection of the first gap over the substrate overlaps the second projection of the second gap over substrate along the projection direction perpendicular to the substrate.

In the display device of the present application, the touch control layer and a signal routing layer of the display panel are disposed in the same layer.

In the display device of the present application, the touch control components in the same touch control layer comprises a driving electrode and an inductive electrode. The second gap is formed between the adjacent driving electrode and inductive electrode. The touch control layer and the cathode layer are formed in the same layer. The first gap overlaps the second gap.

In the display device of the present application, the touch control components in the same touch control layer comprises a plurality of touch control electrodes. The second gap is formed between the adjacent touch control electrodes. An inductance line between the touch control electrodes passes through the first gap, forming a self-contained type touch control unit.

In the display device of the present application, the touch control components in the touch control layer comprises a plurality of touch control electrodes. The second gap is formed between the adjacent touch control electrodes. The touch control layer and the cathode layer are disposed in the same layer. The first gap overlaps the second gap.

In the display device of the present application, the touch control layer comprises a plurality of first touch control layers and a plurality of second touch control layers, and the first touch control layers form first touch control electrodes, and the second touch control layers form inductive electrodes. The first touch control layer and the cathode layer are disposed in the same layer. The adjacent first touch control electrodes form the first gap and the adjacent second touch control electrodes form the second gap. The first projection of the first gap over the substrate crosses with the second projection of the second gap over substrate along a projection direction perpendicular to the substrate. An inductance line between the first touch control electrodes and the second touch control electrodes passes through the first gap, forming a mutual-capacitance type touch control unit.

In the display device of the present application, the first projection of the first gap over the substrate is perpendicular to the second projection of the second gap over substrate.

The beneficial effects of the present application are providing a new display panel and a display device. The display panel comprises a substrate, and a cathode layer disposed over the substrate, having a first gap formed therein. A touch control layer is not disposed at a side of the cathode layer away from the substrate, and the touch control layer is formed with a plurality of touch control components, and the adjacent touch control components in the same touch control layer is formed with a second gap therebetween, wherein the second gap and the first gap fulfill predetermined conditions that applies the touch components as a touch function unit. In this structure, electric field lines generated after the finger touches the screen pass through the structures under the cathode layer but are not shielded by the cathode layer due to the first gap formed over the cathode layer. Therefore, all or portions of the touch control layers can be not disposed over the upmost cathode layer of the organic light-emitting diode (OLED) along the direction away from the backplate, so that the technical problems that the touch control structure in the existing display panel can only be implemented by the on-cell method are solved.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

The following description of the various embodiments is provided to illustrate the specific embodiments. Directional terms mentioned in this application, such as "upper", "lower", "front", "rear", "left", "right", "inside", "outside", "side", etc., are only illustrations of the drawings. Therefore, the directional terminology is used for the purpose of illustration and understanding, but not intended to be limiting. In the figures, elements of similar structures are assigned with the same reference numerals.

The following embodiments are able to solve the problems that the touch control structure of the existing display panel can only be implemented by the on-cell method.

Figure 1:
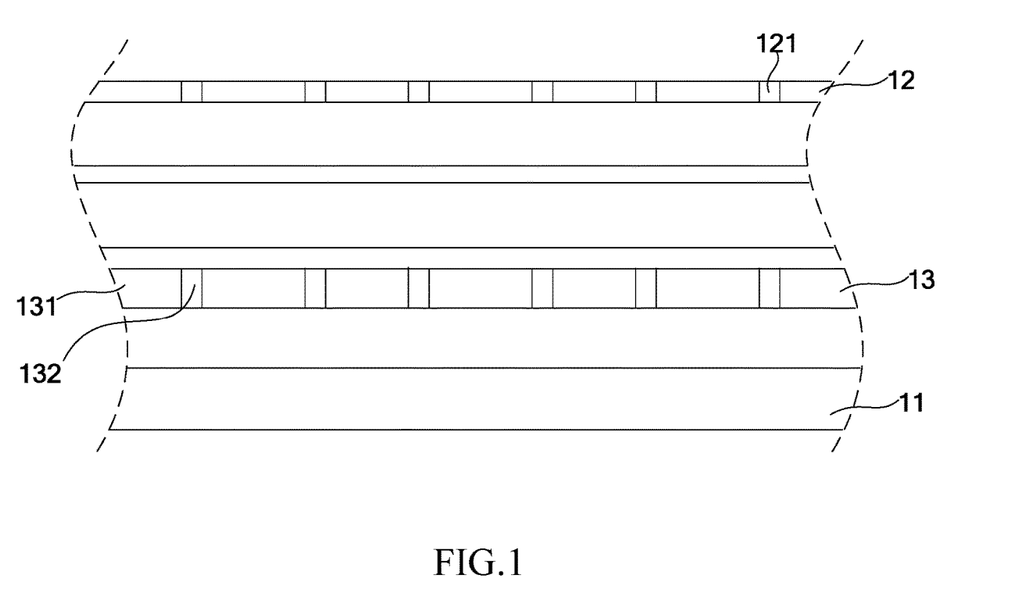
FIG. 1 is a schematic cross-sectional view of a display panel according to an embodiment of the present application.

As shown in FIG. 1, in one embodiment, the present application provides a display panel, comprising:

a substrate 11;

a cathode layer 12 disposed over the substrate, wherein the cathode layer is formed with a first gap 121 therein; and a touch control layer 13, wherein the touch control layer 13 is not disposed at a side of the cathode layer 12 away from the substrate 11, and the touch control layer 13 is provided with a plurality of touch control components 131. The adjacent touch control components 131 in the same touch control layer 131 is formed with a second gap 132 therebetween, wherein the second gap 132 and first gap 121 fulfill predetermined conditions that applies the touch control components as a touch control unit.

The display panel provided by the present embodiment comprises a substrate, and a cathode layer disposed over the substrate, having a first gap formed therein. A touch control layer is not disposed at a side of the cathode layer away from the substrate, and the touch control layer is formed with a plurality of touch control components, and the adjacent touch control components in the same touch control layer is formed with a second gap therebetween, wherein the second gap and the first gap fulfill predetermined conditions that applies the touch components as a touch function unit. In this structure, electric field lines generated after the finger touches the screen pass through the structures under the cathode layer but are not shielded by the cathode layer due to the first gap formed over the cathode layer. Therefore, all or portions of the touch control layers cannot be disposed over the upmost cathode layer of the organic light-emitting diode (OLED) along the direction away from the backplate, so that the technical problems that the touch control structure in the existing display panel can only be implemented by the on-cell method are solved.

The touch control components comprise an optical touch control unit and a capacitive touch control unit. The capacitive touch control unit comprises a mutual-capacitance type touch function unit and a self-contained type touch function unit. The present application can be applied to all existing touch control components.

In one embodiment, the optical touch control unit comprises a light-emitting unit and a light-receiving unit (the second gap is formed therebetween). The first gap of the cathode layer is at least disposed on a light transmission path, and the light transmission path comprises an emission path and a receiving path, so that light can passes through the cathode layer and reaches the end surface, thereby implementing the touch control function.

In one embodiment, the touch control components in the touch control layer comprises a driving electrode and an inductive electrode. The second gap is formed between the adjacent driving electrode and the inductive electrode. An inductance line between the driving electrode and the inductive electrode passes through the first gap, forming a mutual-capacitance type touch control unit.

In one embodiment, the touch control layer is disposed between the cathode layer and the substrate. A first projection of the first gap over the substrate covers a second projection of the second gap over the substrate along a projection direction perpendicular to the substrate.

In one embodiment, the touch control layer is disposed between the cathode layer and the substrate. The first projection of the first gap over the substrate overlaps the second projection of the second gap over substrate along the projection direction perpendicular to the substrate.

In one embodiment, the touch control layer and a signal routing layer of the display panel are disposed in the same layer.

In the embodiment of the present application, a sensor signal of the driving electrode TX and the inductive electrode RX can be fabricated by using the existing low temperature polysilicon (LIPS) array layer, for example the corresponding signal routing layers such as Vi and VDD (both not shown), and the existing pixel driving signals are used to provide sensor-driving signals during working periods of the touch component. The cathode layer above the adjacent areas of the driving electrode TX and the inductive electrode RX are removed. As shown in FIGS. 2A, 2B, 3A, and 3B, for the purpose of illustration, diamond and rectangular shapes are shown as examples, and other shapes, such as triangular shape and the like, are also covered by the present application.

Figure 2A:
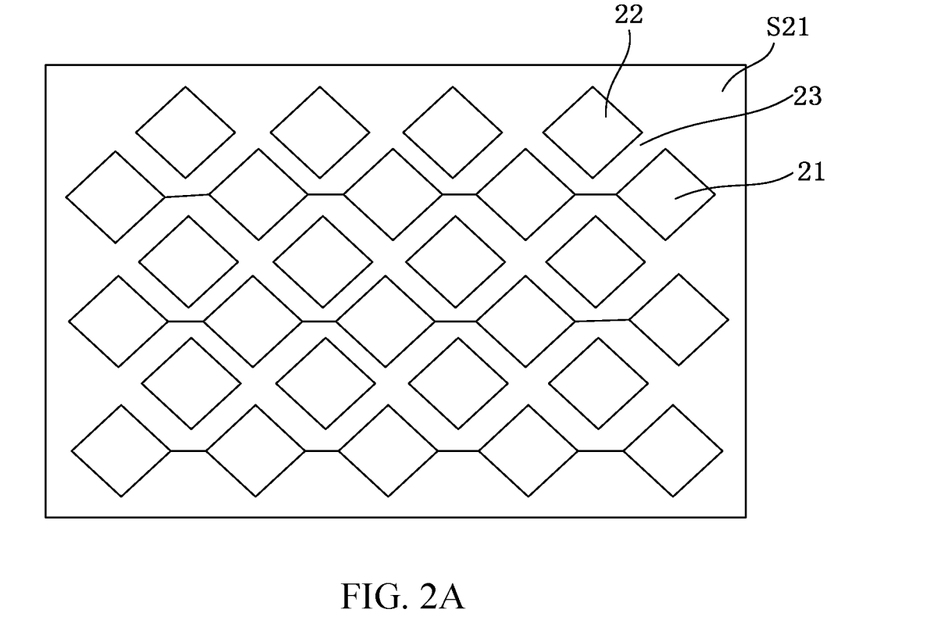
FIGS. 2A and 2B are schematic diagrams of a first arrangement of a touch control layer and a cathode layer according to an embodiment of the present application.

As shown in FIG. 2A, after patterning a signal routing layer S21, sensors having a diamond shape are formed. The driving electrodes 21 in the same row are directly electrically trace-connected, and the inductive electrodes 22 in the same column are electrically bridge-connected. A second gap 23 is formed between the adjacent driving electrode 21 and the inductive electrode 22. In one embodiment, a boundary of the adjacent regions of the driving electrode 21 and the inductive electrode 22 may not be formed as an exactly linear gap, and can be, for example, a complex boundary occlusally engaged with each other, so that a better touch effect can be performed.

Figure 2B:
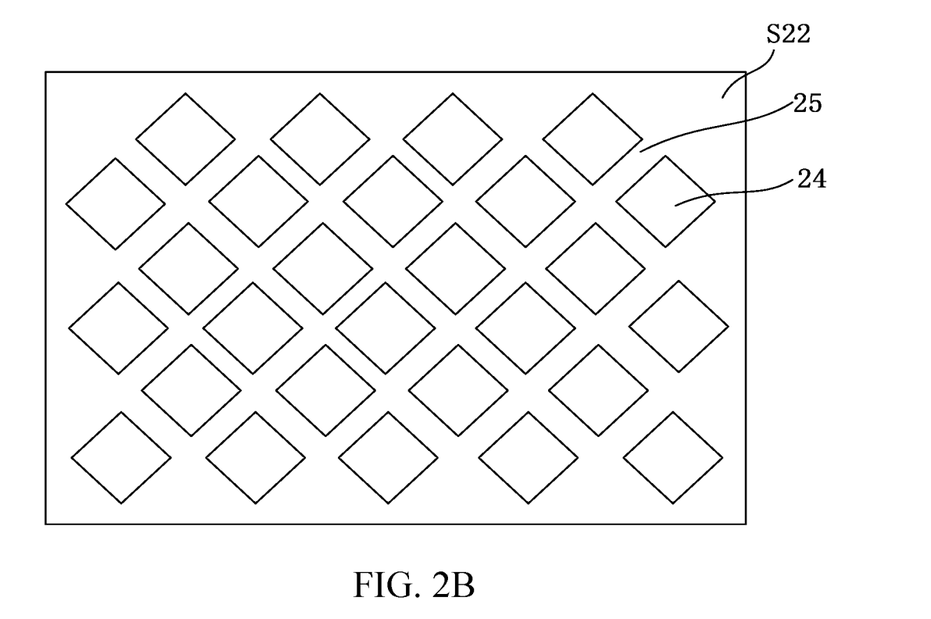

As shown in FIG. 2B, after a cathode layer S22 is patterned, a plurality of diamond-shaped structures 24 are formed, and a first gap 25 is formed between the adjacent diamond-shaped structures 24. The second gap 23 has the same shape as the first gap 25.

Figure 3A:
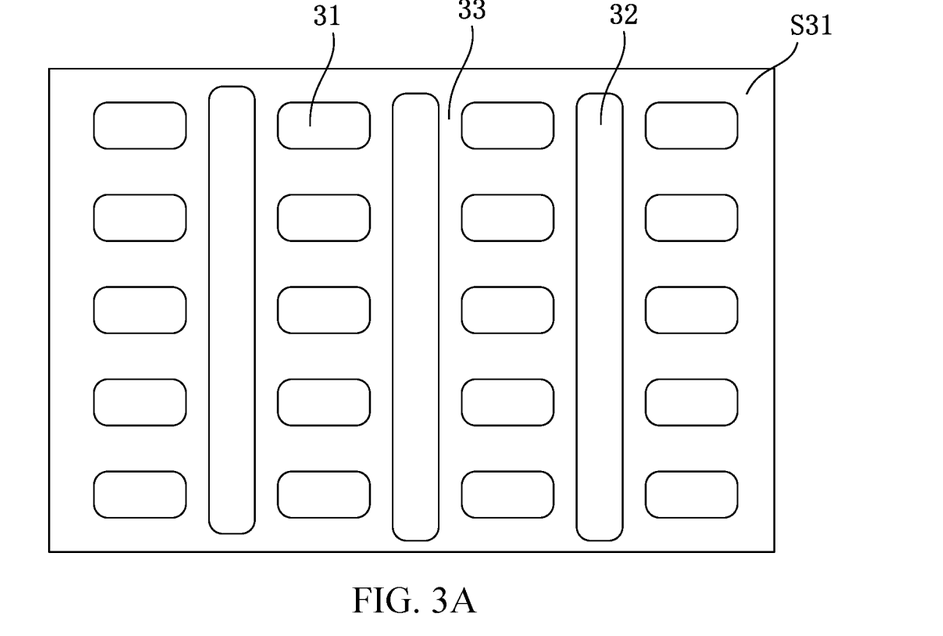
FIGS. 3A and 3B are schematic diagrams of a second arrangement of a touch control layer and a cathode layer according to an embodiment of the present application.

As shown in FIG. 3A, after a signal routing layer S31 is patterned, rectangular sensors are formed, and the driving electrodes 31 in the same row are electrically connected by a way of bridge-connection or via-connection, and the inductive electrodes 32 are directly connected to the driver chip. A second gap 33 is formed between the adjacent driving electrode 31 and the inductive electrode 32. In an embodiment, the boundary of the region adjacent to the driving electrode 31 and the inductive electrode 32 may not be formed as an exactly linear gap, and can be, for example, a complex boundary occlusally engaged with each other, so that a better touch effect can be performed.

Figure 3B:
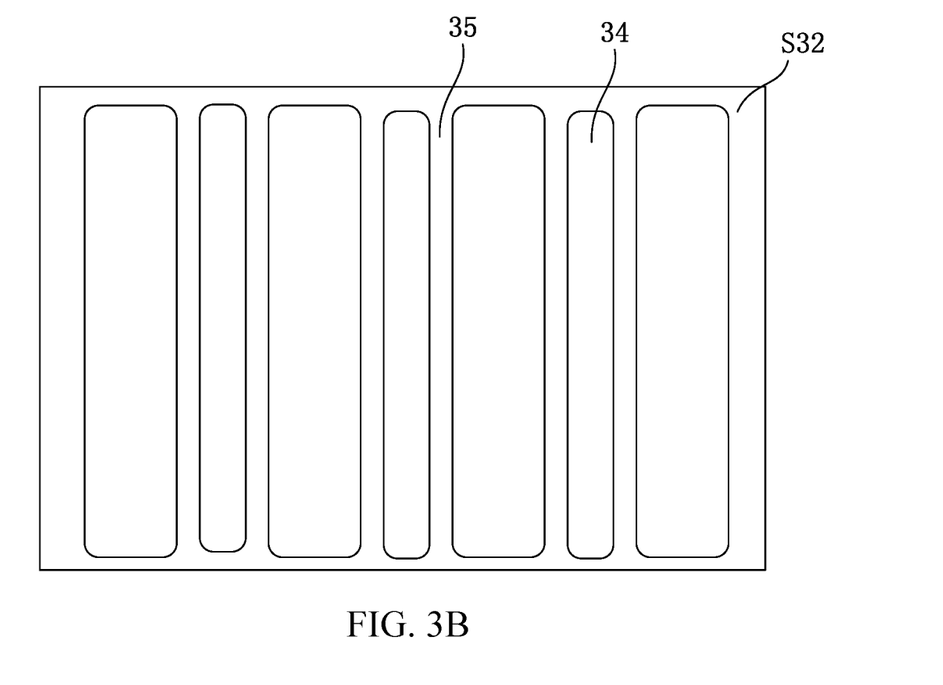

As shown in FIG. 3B, after a cathode layer S32 is patterned, a plurality of rectangular structures 34 are formed, and a first gap 35 is formed between the adjacent rectangular structures 34. The second gap 33 has the same shape as the first gap 35.

In one embodiment, the touch control components in the same touch control layer comprise a driving electrode and an inductive electrode. The second gap is formed between the adjacent driving electrode and inductive electrode. The touch control layer and the cathode layer are formed in the same layer. The first gap overlaps the second gap.

In this embodiment, the cathode layer is used to form traces of the touch electrodes, in which can be used in a time-division multiplexing way during the display and touch control phases. The traces are disposed above or below the cathode, and a transparent insulation layer is disposed between the traces and the cathode layer for insulation.

Figure 4A:
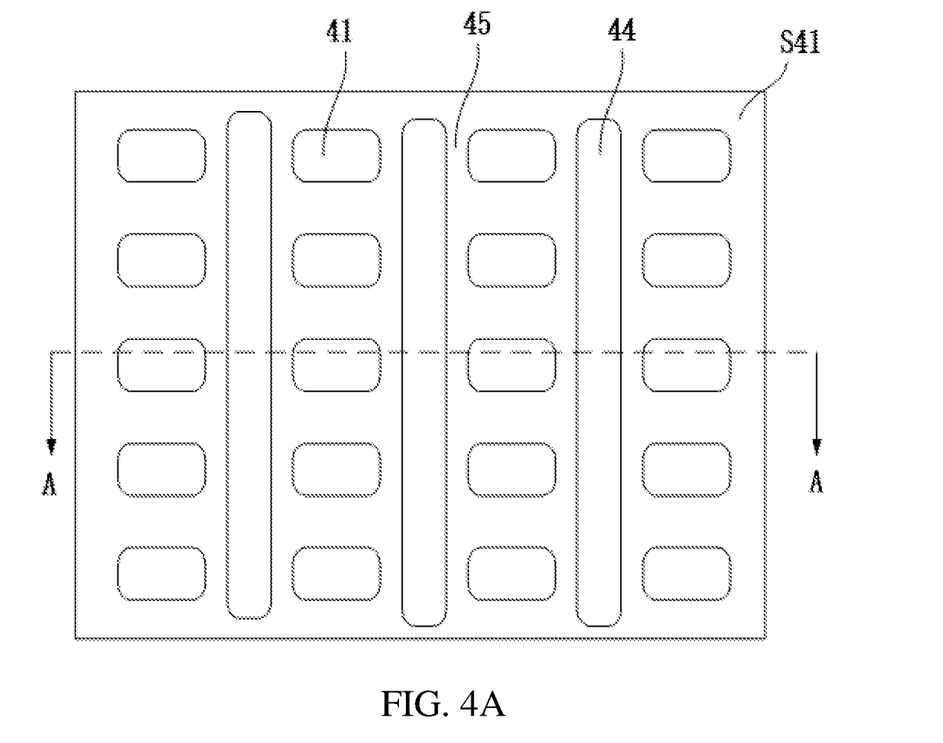
FIGS. 4A and 4B are schematic diagrams of a third arrangement of a touch control layer and a cathode layer according to an embodiment of the present application.
Figure 4B:
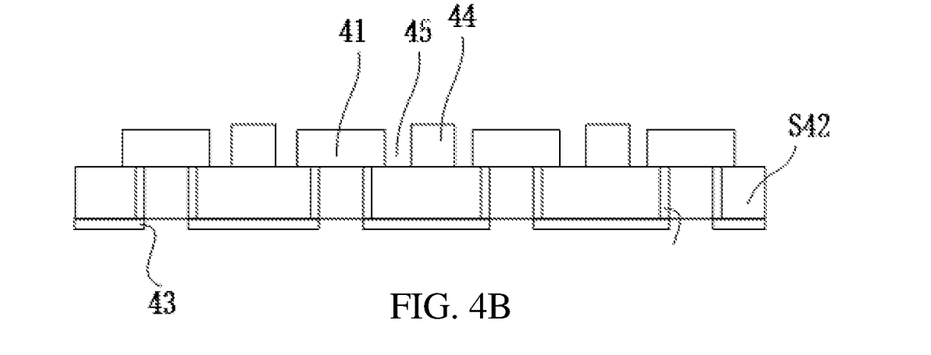

FIGS. 4A and 4B are schematic diagrams of an arrangement of a touch control layer and a cathode layer according to an embodiment of the present application, wherein FIG. 4A is a schematic top view and FIG. 4B is a schematic cross-sectional view taken along the line A-A in FIG. 4A. As shown in FIGS. 4A and 4B, the cathode layer S41 is patterned to form rectangular sensors, and the drive electrodes 41 in the same row are electrically connected by a way of bridge-connection or via-connection. The traces 43 are disposed at a side of the cathode layer S41 toward the backplate, and an insulating layer S42 is disposed between the traces 43 and the cathode layer S41. The inductive electrode 44 is directly connected to the driving chip, and a gap 45 is formed between the adjacent driving electrode 41 and the inductive electrode 44. In one embodiment, the boundary of the adjacent regions of the driving electrode and the inductive electrode may not be formed as an exactly linear gap, and can be, for example, a complex boundary occlusally engaged with each other, so that a better touch effect can be performed.

In one embodiment, the traces 43 are disposed at a side of the cathode layer away from the backplate, and an insulating layer is disposed between the traces 43 and the cathode layer.

In one embodiment, after patterning the cathode layer, sensors of diamond-shape are formed, and driving electrodes in the same column are directly electrically trace-connected, and inductive electrodes in the same column are electrically bridge-connected. A second gap is formed between the adjacent driving and inductive electrodes, i.e. the first gap. In one embodiment, the boundary of the adjacent regions of the driving electrode and the inductive electrode may not be formed as an exactly linear gap, and can be, for example, a complex boundary occlusally engaged with each other, so that a better touch effect can be performed.

In one embodiment, the touch control components in the touch control layer comprises a plurality of touch control electrodes. The second gap is formed between the adjacent touch control electrodes. An inductance line between the touch control electrodes passes through the first gap, forming a self-contained type touch control unit.

In one embodiment, the touch control layer is disposed between the cathode layer and the substrate. A first projection of the first gap over the substrate covers a second projection of the second gap over substrate along a projection direction perpendicular to the substrate.

In one embodiment, the touch control layer is disposed between the cathode layer and the substrate. The first projection of the first gap over the substrate overlaps the second projection of the second gap over the substrate along the projection direction perpendicular to the substrate.

In one embodiment, the touch control layer and the signal routing layer of the display panel are disposed in the same layer.

In one embodiment, the touch control components in the touch control layer comprise a plurality of touch control electrodes, and the second gap is formed between the adjacent touch control electrodes. The touch control layer and the cathode layer are disposed in the same layer, and the first gap overlaps the second gap.

Regarding to the self-contained type touch control unit, placements of each of the touch control electrodes (normally driving electrode) may refer to those shown in the mutual-capacitance type touch control unit and are not described here again.

In one embodiment, the touch control layer comprises a plurality of first touch control layers and a plurality of second touch control layers, and the first touch control layers form first touch control electrodes, and the second touch control layers form inductive electrodes. The touch control layer and the cathode layer are disposed in the same layer. The adjacent first touch control electrodes form the first gap and the adjacent second touch control electrodes form the second gap. The first projection of the first gap over the substrate crosses with the second projection of the second gap over substrate along a projection direction perpendicular to the substrate. An inductance line between the first touch control electrodes and the second touch control electrodes passes through the first gap, forming a mutual-capacitance type touch control unit.

In one embodiment, the first projection of the first gap over the substrate is perpendicular to the second projection of the second gap over substrate.

Figure 5A:
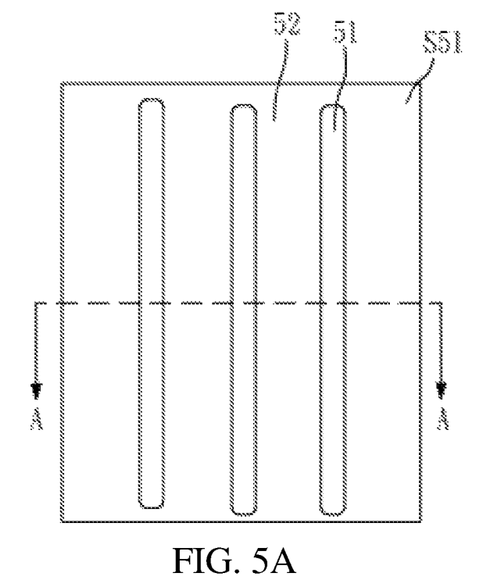
FIGS. 5A, 5B, 5C, and 5D are schematic diagrams of a fourth arrangement of a touch control layer and a cathode layer according to an embodiment of the present application.
Figure 5B:
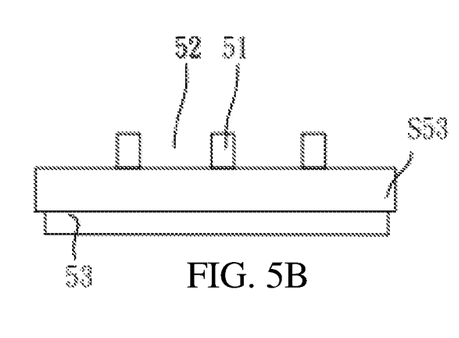
Figures 5C, 5D:
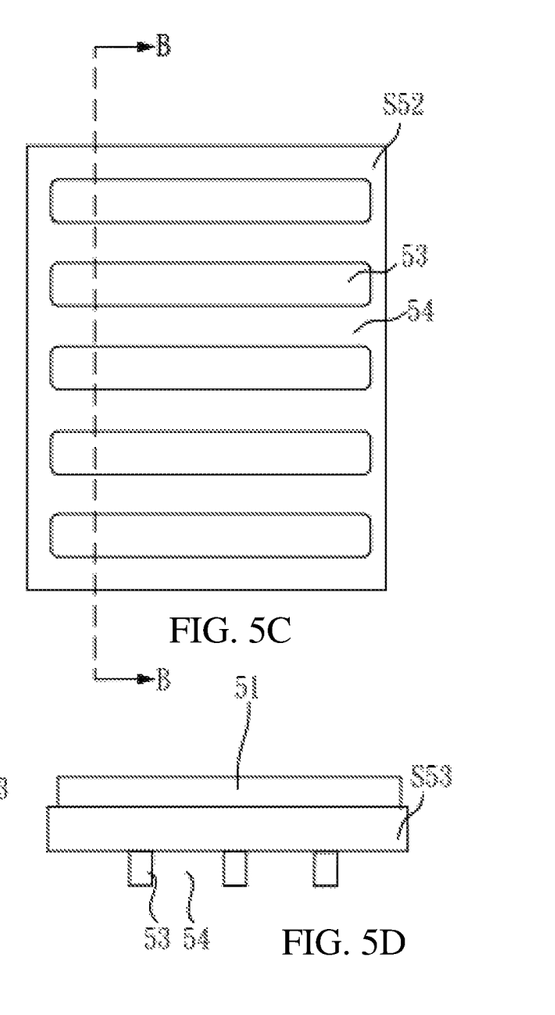

FIGS. 5A, 5B, 5C and 5D are schematic diagrams of an arrangement of a touch control layer and a cathode layer according to an embodiment of the present application, wherein FIG. 5A is a schematic top view and FIG. 5B is a schematic cross-sectional view taken along the line A-A in FIG. 5A, and wherein FIG. 5C is another schematic top view and FIG. 5D is a schematic cross-sectional view taken along the line B-B in FIG. 5C. As shown in FIGS. 5A, 5B, 5C, and 5D, one embodiment of the present application uses a cathode layer S51 to form first touch control electrodes 51. The first touch control electrodes 51 in the same row/column are via-connected or bridge-connected, and a first gap 52 is formed between the first touch control electrodes 51. Another touch control layer S52 is formed to form second touch control electrodes 53, and a second gap is formed between the second touch control electrodes. The second gap 54 is perpendicular to the first gap 52. The touch control layer 52 is disposed over the cathode layer along a direction away from a backplate. An insulating layer S53 is disposed between the touch control layer S52 and the cathode layer S51, so that performs display and touch control phases in the time-division multiplexing way.

In one embodiment, the adjacent first touch control electrodes are directly trace-connected.

In one embodiment, the touch control layer S52 is disposed over the cathode layer S51 and an insulating layer is disposed between the touch control layer S52 and the cathode layer S51.

For the purposes of forming the cathode layer by a low-temperature process and avoiding damages to the light-emitting materials, the present application provides a plurality of forming methods.

A photo spacer (PS) pillar of the existing supporting wall is a tall cylindrical supporting pillar having a trapezoid cross-section and a height of 1.5 μm, which serves as a support of a masking for the evaporation process, and it is entirely covered with a cathode layer. In the present application, the height of the PS pillar is relatively elevated, so that the cathode materials deposited by conventional processes will not entirely cover the film layer. Due to the taller PS pillar, the cathode material is separated to form gaps, so that patterning of the cathode is achieved.

Figure 6A:
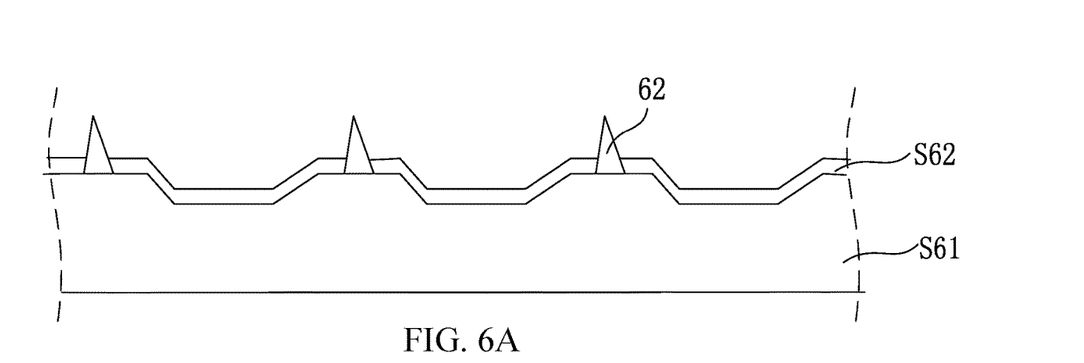
FIGS. 6A, 6B, and 6C are schematic diagrams of an arrangement of a display panel according to an embodiment of the present application.
Figure 6B:
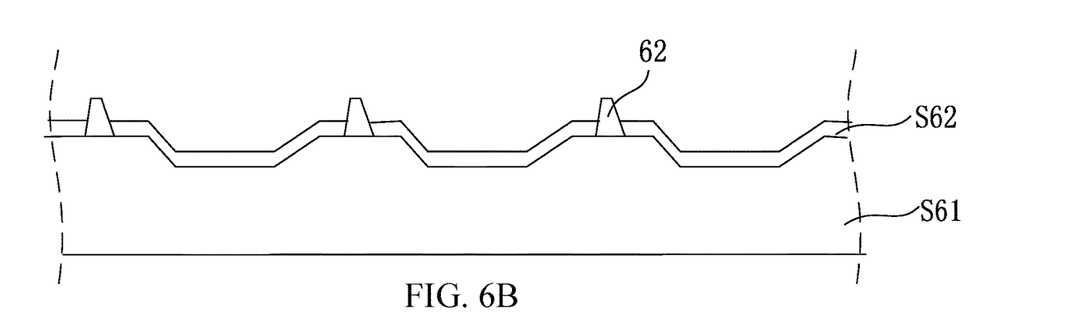
Figure 6C:
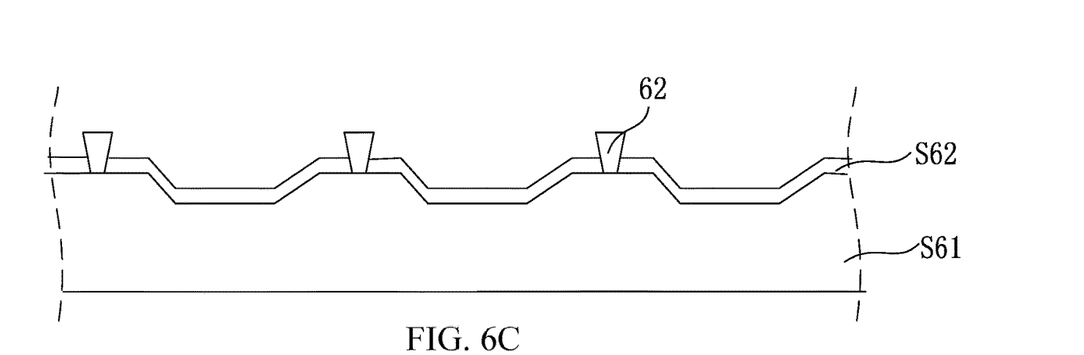

In one embodiment, as shown in FIGS. 6A, 6B, and 6C, the display panel comprises a pixel definition layer S61, and a supporting wall 62 is disposed over the pixel definition layer S61. The height of the supporting wall 62 is greater than the height of the cathode layer S62, thereby dividing the cathode layer S62 into the gaps.

In one embodiment, as shown in FIG. 6A, the supporting wall 62 has a triangular cross-section.

In one embodiment, the supporting wall 62 has an isosceles triangular cross-section.

In this embodiment, the PS pillar is formed into a taller-height shape with an isosceles triangular shape, and the cathode material is separated to realize the patterning of the cathode.

In one embodiment, as shown in FIG. 6B, the supporting wall 62 has a trapezoidal cross-section.

In one embodiment, the supporting wall 62 has an isosceles trapezoidal cross-section.

In this embodiment, the PS pillar is made into a cylindrical supporting pillar having a relatively tall height and an isosceles trapezoidal cross-section. Due to the tall height, the cathode material can be separated and patterning of the cathode can be realized under the condition that the cathode deposition process remain unchanged.

In one embodiment, as shown in FIG. 6C, the supporting wall 62 has an inverted trapezoidal cross-section.

In one embodiment, the supporting wall 62 has an inverted isosceles trapezoidal cross-section.

In this embodiment, the PS pillar is formed as a cylindrical supporting pillar having a relatively tall height and an inverted isosceles trapezoidal shape. Due to its tall height, the upper width and the narrow shape make it more capable of separating the cathode material and having best patterning results in realizing patterning of the cathode. The adjacent sensor pads (Tx/Rx) in different rows or columns) of the same type and the adjacent sensor pads (such as between adjacent Tx and Rx) of different types are separated by PS pillars to realize patterning of the cathode.

The existing method for fabricating the cathode layer is achieved by using a common metal mask (CMM) to deposit a blanket cathode over the EL layer of the light-emitting material, and the RGB pixel materials of the OLED device is fabricated by using a fine metal mask (FMM). Therefore, when patterning a cathode, the present application directly realizes the patterning by using the FMM and can ensure that the accuracy thereof satisfies the high (pixels per inch) PPI design to the display area.

Figure 7A:
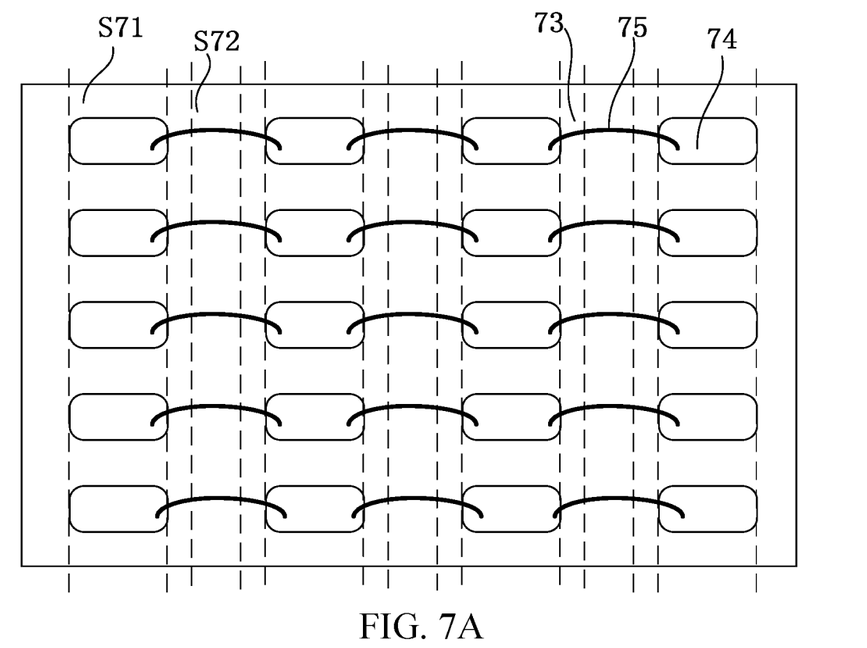
FIGS. 7A and 7B are schematic diagrams showing the formation of a cathode layer according to an embodiment of the present application.
Figure 7B:
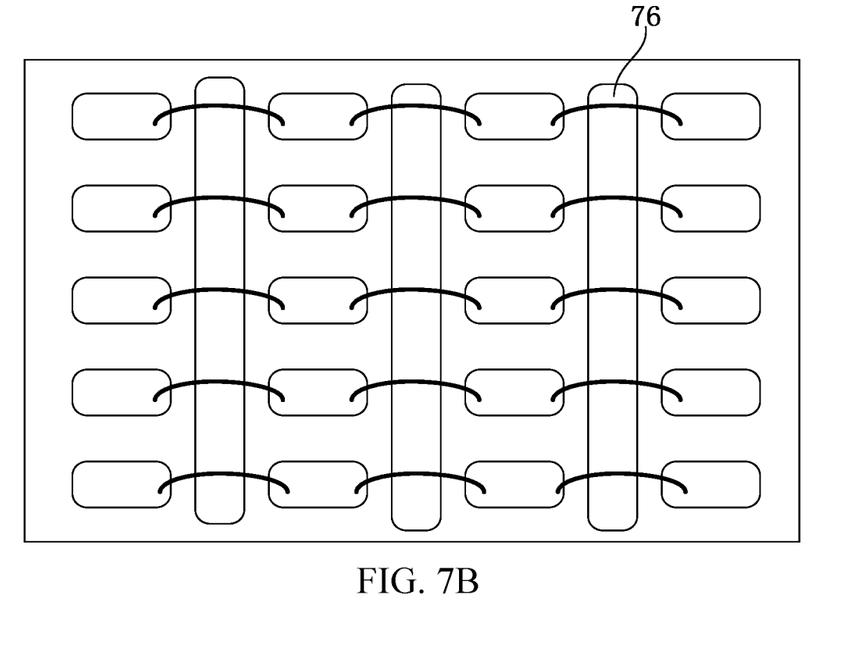

In one embodiment, as shown in FIGS. 7A and 7B, the cathode layer includes a first region S71 and a second region S72 which are alternately disposed, and the first gap 73 is formed between the first region and the second region. The cathode layer in the first region and the cathode layer in the second region are formed by a plurality of processes.

As shown in FIG. 7A, a first FMM is first used to selective deposite and form a first region S71 functioning as the driving electrode 74, and it is connected to the trace 75.

As shown in FIG. 7B, the second region S72 shown in FIG. 7A is then selectively deposited using the second FMM to function as the inductive electrode 76, and it is made to be isolated from the the driving electrode 74 and the trace 75 shown in FIG. 7A.

Finally, a layer of thin film encapsulation (TFE, not shown) is deposited to encapsulate the entire cathode layer.

OLED light-emitting devices damaged by the photo and etch processes can be avoided because no photo and etch process are required.

In one embodiment, the touch control layer and the cathode layer are the same layer, the cathode layer in the first region forms a first touch control electrode, and the cathode layer in the second region forms a second touch control electrode.

In one embodiment, the first touch electrode is a driving electrode and the second touch electrode is an inductive electrode, or the first touch electrode is an inductive electrode, and the second touch electrode is a driving electrode.

In one embodiment, the present application applies a low temperature material and a low temperature process, and uses photoresists and low temperature photoresist (PR) glue, and uses conventional etching process by a adding a passivation layer and a protective layer during the process, thereby avoids etching and damages the OLED type light emitting device and achieving cathode patterning. In this embodiment, the display panel comprises a passivation layer and a protective layer disposed over the cathode layer in sequence, and the first gap is formed by etching in a process performed to the passivation layer, the protection layer, and the cathode layer.

In one embodiment, prior to entirely depositing the cathode, the present application coats a patterned release adhesive, and the release adhesive is removed after depositing the cathode to realize patterning of the cathode. In this embodiment, the first gap is a release layer disposed under the cathode layer and is formed by peeling.

In the meantime, in order to apply the present application to an actual product, in one embodiment, the present application provides a display device, comprising a display panel. The display panel comprises:

a substrate;

a cathode layer disposed over the substrate, wherein the cathode layer is formed with a first gap therein; and a touch control layer, wherein the touch control layer is not disposed at a side of the cathode layer away from the substrate, and the touch control layer is provided with a plurality of touch control components, and the adjacent touch control components in the same touch control layer is formed with a second gap therebetween;

wherein the first and second gaps fulfill predetermined conditions that use the touch control components as a touch control unit.

In one embodiment, in the display device of the present application, the touch control components in the same touch control layer comprises a driving electrode and an inductive electrode. The second gap is formed between the adjacent driving electrode and inductive electrode. An inductance line between the driving electrode and the inductive electrode passes through the first gap, forming a mutual-capacitance type touch control unit.

In one embodiment, in the display device of the present application, the touch control layer is disposed between the cathode layer and the substrate. A first projection of the first gap over the substrate covers a second projection of the second gap over substrate along a projection direction perpendicular to the substrate.

In one embodiment, in the display device of the present application, the touch control layer is disposed between the cathode layer and the substrate. The first projection of the first gap over the, substrate overlaps the second projection of the second gap over substrate along the projection direction perpendicular to the substrate.

In one embodiment, in the display device of the present application, the touch control layer and a signal routing layer of the display panel are disposed in the same layer.

In one embodiment, in the display device of the present application, the touch control components in the same touch control layer comprises a driving electrode and an inductive electrode. The second gap is formed between the adjacent driving electrode and inductive electrode. The touch control layer and the cathode layer are formed in the same layer, and the first gap overlaps the second gap.

In one embodiment, in the display device of the present application, the touch control components in the touch control layer comprises a plurality of touch control electrodes. The second gap is formed between the adjacent touch control electrodes. An inductance line between the touch control electrodes passes through the first gap, forming a self-contained type touch control unit.

In one embodiment, in the display device of the present application, the touch control components in the touch control layer comprises a plurality of touch control electrodes. The second gap is formed between the adjacent touch control electrodes. The touch control layer and the cathode layer are disposed in the same layer. The first gap overlaps the second gap.

In one embodiment, in the display device of the present application, the touch control layer comprises a plurality of first touch control layers and a plurality of second touch control layers, and the first touch control layers form first touch control electrodes, and the second touch control layers form inductive electrodes. The first touch control layer and the cathode layer are disposed in the same layer. The adjacent first touch control electrodes form the first gap and the adjacent second touch control electrodes form the second gap. The first projection of the first gap over the substrate crosses with the second projection of the second gap over substrate along a projection direction perpendicular to the substrate. An inductance line between the first touch control electrodes and the second touch control electrodes passes through the first gap, forming a mutual-capacitance type touch control unit.

In one embodiment, in the display device of the present application, the first projection of the first gap over the substrate is perpendicular to the second projection of the second gap over the substrate.

Based on the previously embodiments:

The present application provides a novel display panel and display device, comprising: a substrate, and a cathode layer disposed over the substrate, having a first gap formed therein. A touch control layer is not disposed at a side of the cathode layer away from the substrate, and the touch control layer is formed with a plurality of touch control components, and the adjacent touch control components in the same touch control layer is formed with a second gap therebetween, wherein the second gap and the first gap fulfill predetermined conditions that use to the touch components as a touch function unit. In this structure, electric field lines generated after the finger touches the screen pass through the structures under the cathode layer but are not shielded by the cathode layer due to the first gap formed over the cathode layer. Therefore, all or portions of the touch control layers cannot be disposed over the upmost cathode layer of the organic light-emitting diode (OLED) along the direction away from the backplate, so that the technical problems that the touch control structure in the existing display panel can only be implemented by the on-cell method are solved.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A display panel, comprising:
   a substrate;
   a cathode layer disposed over the substrate, wherein the cathode layer is formed with a first gap therein;
   a touch control layer, wherein the touch control layer is not disposed at a side of the cathode layer away from the substrate, and the touch control layer is provided with a plurality of touch control components, and adjacent touch control components in the touch control layer are formed with a second gap therebetween; and
   a pixel definition layer, wherein a supporting wall is disposed over the pixel definition layer, and a height of the supporting wall is greater than a height of the cathode layer, thereby forming the first gap in the cathode layer;
   wherein the touch control components function as a touch control unit.

2. The display panel as claimed in claim 1, wherein:
   the touch control components in the touch control layer comprise a driving electrode and an inductive electrode, wherein the driving electrode and the inductive electrode are adjacent; and
   the second gap is formed between the adjacent driving electrode and inductive electrode.

3. The display panel as claimed in claim 2, wherein:
   the touch control layer is disposed between the cathode layer and the substrate; and
   a first projection of the first gap over the substrate covers a second projection of the second gap over substrate along a projection direction perpendicular to the substrate.

4. The display panel as claimed in claim 3, wherein:
   the touch control layer is disposed between the cathode layer and the substrate; and
   the first projection of the first gap over the substrate overlaps the second projection of the second gap over substrate along the projection direction perpendicular to the substrate.

5. The display panel as claimed in claim 3, wherein the touch control layer and a signal routing layer of the display panel are disposed in a same layer.

6. The display panel as claimed in claim 1, wherein:
   the touch control components in the touch control layer comprise a plurality of touch control electrodes including adjacent touch control electrodes; and
   the second gap is formed between the adjacent touch control electrodes.

7. A display device comprising a display panel, wherein the display panel comprises:
   a substrate;
   a cathode layer disposed over the substrate, wherein the cathode layer is formed with a first gap therein;
   a touch control layer, wherein the touch control layer is not disposed at a side of the cathode layer away from the substrate, and the touch control layer is provided with a plurality of touch control components, and adjacent touch control components in the touch control layer are formed with a second gap therebetween; and
   a pixel definition layer, wherein a supporting wall is disposed over the pixel definition layer, and a height of the supporting wall is greater than a height of the cathode layer, thereby forming the first gap in the cathode layer;
   wherein the touch control components function as a touch control unit.

8. The display device as claimed in claim 7, wherein:
   the touch control components in the touch control layer comprise a driving electrode and an inductive electrode, wherein the driving electrode and the inductive electrode are adjacent; and
   the second gap is formed between the adjacent driving electrode and inductive electrode.

9. The display device as claimed in claim 8, wherein:
   the touch control layer is disposed between the cathode layer and the substrate; and
   a first projection of the first gap over the substrate covers a second projection of the second gap over substrate along a projection direction perpendicular to the substrate.

10. The display device as claimed in claim 9, wherein:
    the touch control layer is disposed between the cathode layer and the substrate; and
    the first projection of the first gap over the substrate overlaps the second projection of the second gap over the substrate along the projection direction perpendicular to the substrate.

11. The display device as claimed in claim 9, wherein the touch control layer and a signal routing layer of the display panel are disposed in a same layer.

12. The display device as claimed in claim 7, wherein:
    the touch control components in the touch control layer comprise a plurality of touch control electrodes including adjacent touch control electrodes; and
    the second gap is formed between the adjacent touch control electrodes.

* * * * *